US008930166B1

(12) United States Patent
Das et al.

(10) Patent No.: US 8,930,166 B1
(45) Date of Patent: Jan. 6, 2015

(54) METHOD AND APPARATUS FOR EFFICIENT EXTRACTION OF INFORMATION FROM SIGNALS

(75) Inventors: Sreerupa Das, Oviedo, FL (US); Ashis K. Maity, Oviedo, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 404 days.

(21) Appl. No.: 13/311,912

(22) Filed: Dec. 6, 2011

(51) Int. Cl.
G06F 17/00 (2006.01)
G06K 9/00 (2006.01)
G06F 17/50 (2006.01)
G01R 31/28 (2006.01)

(52) U.S. Cl.
CPC ........ G06K 9/00496 (2013.01); G06F 17/5036 (2013.01); G01R 31/2837 (2013.01)
USPC .......................... 702/184; 702/186; 705/36 R (58) Field of Classification Search
CPC ... G01F 23/284; G01F 17/5036; G01S 13/88; G01S 2007/356; G06K 9/00496; G01R 31/2837
USPC ................................. 702/184, 185; 705/36 R
See application file for complete search history.

(56) References Cited

U.S. PATENT DOCUMENTS

| 5,486,762 | A | * | 1/1996 | Freedman et al. | ............ | 324/303 |
| 5,996,406 | A | * | 12/1999 | Ward | ............ | 73/290 R |
| 6,570,842 | B1 | * | 5/2003 | Landolsi | ............ | 370/210 |
| 6,606,580 | B1 | * | 8/2003 | Zedda et al. | ............ | 702/185 |
| 6,775,646 | B1 | * | 8/2004 | Tufillaro et al. | ............ | 703/2 |
| 7,653,449 | B2 | * | 1/2010 | Hunter et al. | ............ | 700/99 |
| 8,213,883 | B1 | * | 7/2012 | Broadwell | ............ | 455/114.3 |
| 8,405,940 | B2 | * | 3/2013 | Schweitzer et al. | ............ | 361/42 |
| 2006/0200400 | A1 | * | 9/2006 | Hunter et al. | ............ | 705/36 R |
| 2008/0048603 | A1 | * | 2/2008 | Discenzo | ............ | 318/561 |
| 2010/0066722 | A1 | * | 3/2010 | Mouri | ............ | 345/213 |
| 2010/0185557 | A1 | * | 7/2010 | Hunter et al. | ............ | 705/36 R |
| 2011/0085272 | A1 | * | 4/2011 | Schweitzer et al. | ............ | 361/47 |
| 2011/0267340 | A1 | * | 11/2011 | Kraus et al. | ............ | 345/419 |

OTHER PUBLICATIONS

Unknown, "Compressed Sensing," Wikipedia, Accessed Nov. 1, 2011, 4 pages.
Ellenburg, J., "Fill in the Blanks: Using Math to Turn Lo-Res Datasets into Hi-Res Samples," Wired, Feb. 22, 2010, 6 pages.
Fornasier, M. et al., "Compressive Sensing," Apr. 18, 2010, 49 pages.
Balouchestani, M. et al., "Compressed Sensing in Wireless Sensor Networks: Survey," Canadian Journal on Multimedia and Wireless Networks, vol. 2 No. 1, Feb. 2011, 4 pages.

* cited by examiner

Primary Examiner — Carol S Tsai
(74) Attorney, Agent, or Firm — Withrow & Terranova, PLLC (57) ABSTRACT

A method and device for extracting information from data representing a signal is disclosed. A set of data comprising a plurality of measurements of the signal generated at a first sampling rate is received from a sensor. A subset of the plurality of measurements is selected. A plurality of feature variables, each of which corresponds to a particular feature in a set of features that may be present in the signal are determined by deriving an underdetermined system of equations based on a selected basis function, the subset of the plurality of measurements, and the plurality of feature variables and corresponding features. The underdetermined system of equations is solved to determine a value for each feature variable using a non-linear optimization technique to minimize an $L_1$ norm of the set of features. Feature information is stored in a storage medium.

18 Claims, 5 Drawing Sheets

METHOD AND APPARATUS FOR EFFICIENT EXTRACTION OF INFORMATION FROM SIGNALS

FIELD OF THE DISCLOSURE

The present disclosure relates generally to signal processing, and in particular to extracting features from a signal based on a number of samples of the signal that is substantially less than that required by conventional sampling theorem.

BACKGROUND

Increasingly, machines are being equipped with sensors that measure attributes of the machines. The measurements may be analyzed and processed by a system, such as a neural network or a Bayesian network, to ascertain, for example, a current condition of the machine or a current or future need for maintenance or replacement of the machine. Prognostic and Health Management (PHM) and/or Condition-based maintenance (CBM) (collectively "PHM/CBM") is an increasingly popular field that heavily utilizes such data in order to maintain machines. As the number of machines and number of sensors grows, sensor data becomes substantial. For example, in order to capture frequency components of a signal, the signal is sampled at twice the rate of the highest frequency in the signal, in accordance with the Nyquist-Shannon sampling theorem. The data can then be processed, via a discrete Fourier transform or other suitable transform for example, to extract frequency features from the data. These frequency features can be markers, or indicators, that may be useful in evaluating the condition of the machine, or of particular components of the machine. However, for signals with relatively high frequency components, such as signals associated with vibration analysis, such sampling results in the generation of substantial, if not massive, amounts of data. This data must be stored and then processed, requiring both substantial amounts of storage and substantial processing power.

Accordingly, there is a need for a mechanism by which features can be extracted from signals for use in monitoring and evaluating the health of a machine, that utilizes substantially less data than that generated in accordance with conventional signal sampling theorem, in order to effectively reduce data storage and processor requirements.

SUMMARY

The present disclosure relates to the analysis of measurements of a signal generated by a machine. The analysis may be used to ascertain a health of the machine, or of components of the machine. In one embodiment, a sensor generates a set of data that includes a plurality of measurements of the signal generated by the machine. The plurality of measurements is taken at a first sampling rate, such as a sampling rate in accordance with the Nyquist-Shannon sampling theorem. Accordingly, the sampling rate is at least twice the rate of a highest frequency component expected in the signal. The set of data is randomly sampled to generate a subset of measurements. The subset of measurements may have substantially fewer measurements than the number of measurements in the set of data generated by the sensor. In one embodiment, the number of measurements in the subset may be between about 10 percent and 15 percent of the number of measurements in the set of data.

A basis function is selected based on the particular features of interest. In one embodiment, the features of interest may be frequency components of the signal. Accordingly, a discrete Fourier transform may be selected as the basis function. Feature variables that correspond to the set of features are then determined. For example, where the features comprise frequency components, the feature variables may identify the amplitude of the signal at particular frequencies. Values for the feature variables are determined by deriving an underdetermined system of equations based on the selected basis function, the subset of measurements, and the feature variables and corresponding features. The underdetermined system of equations is solved to determine the values of the feature variables using a non-linear optimization technique to minimize an $L_1$ norm of the set of features. Feature information that includes at least some of the feature variables and corresponding features is stored in a storage medium.

In this manner, feature information may be extracted from a signal with far less data than typically required in accordance with the Nyquist-Shannon sampling theorem. This greatly reduces the amount of storage required to store information that characterizes signals associated with the machines.

The feature information may be used, in one embodiment, by a prognostics module, or a condition-based maintenance module, to ascertain a health of the machine, or of one or more components of the machine. Multiple sets of feature information, determined based on multiple subsets of measurements taken over a period of time, may be used to analyze patterns that may be useful in ascertaining, for example, imminent failure of the machine, or a component thereof.

In one embodiment, the signal characterizes a vibration associated with the machine. The determined frequency information may identify the presence of certain frequencies in the signal that indicate abnormal, or less than optimal, operation of one or more components of the machine, such as a shaft, a gear or a bearing. Identification of such features may also result in generation of a work order to perform specific maintenance on the machine.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings, incorporated in and forming a part of this specification, illustrate several aspects of the disclosure, and together with the description, serve to explain the principles of the disclosure.

DETAILED DESCRIPTION

The embodiments set forth below represent the information necessary to enable those skilled in the art to practice the disclosure and to illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

The present disclosure relates to the extraction of features from signals based on a random selection of far fewer samples of the signal than required in accordance with conventional sampling theorem, such as the Nyquist-Shannon sampling theorem. The present disclosure requires substantially less data to be stored and lower processing requirements, which is increasingly important as disciplines such as Prognostic and Health Management and/or Condition-based maintenance (PHM/CBM) become more popular. Features can comprise any desirable attribute of interest of the signal. For example, where the attributes of interest are frequency components of the signal, then the features may comprise frequencies, or frequency ranges.

Figure 1:
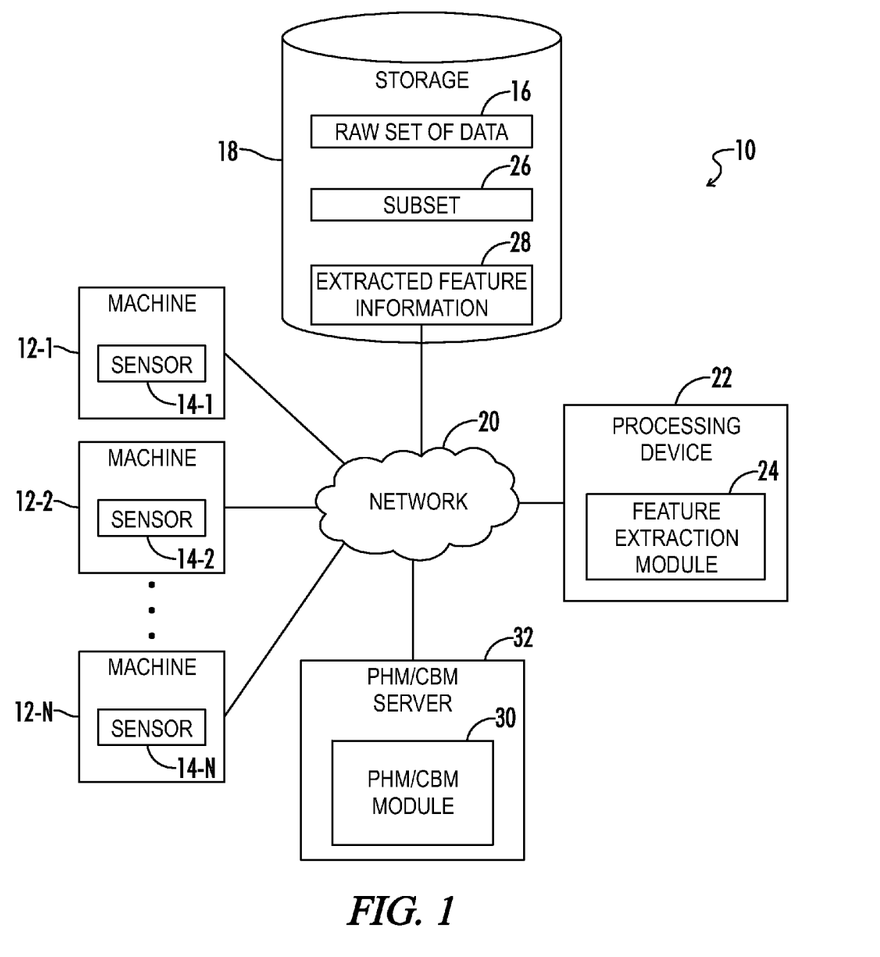
FIG. 1 is a block diagram of an exemplary system in which embodiments of the present disclosure may be practiced.

FIG. 1 is a block diagram of an exemplary system 10 in which embodiments of the present disclosure may be practiced. The system 10 includes one or more machines 12-1, 12-2-12-N (generally, machines 12). The machines 12 may comprise any apparatus, vehicle, or other item or entity, either stationary or mobile, which may be monitored by a sensor. Non-limiting examples of machines 12 are automobiles, trucks, planes, helicopters, factory robots, or the like. Each machine 12 includes one or more sensors 14-1, 14-2-14-N (generally, sensors 14) that sense an attribute of the machine 12. The sensors 14 may comprise any suitable sensor, such as an accelerometer, dynamometer, charge amp, thermocouple, DSP, tachometer, or the like.

Conventionally, the sensors 14 generate data such as a set of measurements of a desired attribute at a desired sampling rate and typically store such data locally on the respective machine 12 for later collection or transmission. The data can alternatively be stored remotely, such as in a raw set of data 16 in a storage 18 via a network 20. The set of measurements may, in one embodiment, be in a time domain. The amount of data generated by such sensors 14 may be substantial. For example, where the attribute being sampled comprises a signal with high-frequency components, in accordance with the Nyquist-Shannon sampling theorem such attributes are sampled at a rate that is at least twice the highest expected frequency component in the sampled signal. Certain types of signals, such as those associated with vibration analysis, frequently contain relatively high-frequency components and thus must be sampled at a relatively high sampling rate, resulting in a substantial amount of generated sensor data.

The network 20 represents any public or private network, or combination thereof, suitable for facilitating data exchange among the various elements discussed herein. While using the network 20 to transfer data between elements may be desirable, it is not necessary for the embodiments of the disclosure, and the transfer of data between the elements may occur via other mechanisms, such as via portable flash drives or the like, or via any other desired or suitable data transfer mechanism.

In one embodiment, a processing device 22 includes a feature extraction module 24 that implements aspects of the present embodiments. The feature extraction module 24 may be firmware, hardware, software, or any combination thereof. Because the processing device 22 implements the functionality of the feature extraction module 24, the functionality performed by the feature extraction module 24 may be generally attributed herein to the processing device 22.

The processing device 22 accesses, in one embodiment, the raw set of data 16 from the storage 18. The processing device 22 then randomly selects, or samples, the measurements in the raw set of data 16 to generate a subset 26 of the measurements. The subset 26 comprises fewer members than that of the raw set of data 16. In one embodiment, the subset 26 may comprise about 10% (i.e., 9-11%) of the number of members of the raw set of data 16. The processing device 22 then determines the feature variables that correspond to a set of features that may be present in the signal based on the subset 26 rather than the raw set of data 16. The set of features may, in one embodiment, be in a frequency domain. For example, the set of features that may be present in the signal may comprise a set of frequency components, such as a set of frequencies or a set of frequency bins, or ranges. For each such frequency component, a corresponding feature variable is determined that quantifies an attribute of the corresponding frequency component. For example, the feature variable may quantify the amplitude of the frequency component. In one embodiment, the set of features is sparse. In other words, the majority of the frequency components of the set of frequency components that may be present in the signal are zero. Accordingly, the feature variable corresponding to each such frequency component is zero. One process for determining the feature variables based on the subset 26 will be discussed in greater detail with reference to FIG. 2, below.

The feature variables and corresponding features, or selected feature variables and corresponding features, may be stored as extracted feature information 28 in the storage 18. In one embodiment, only non-zero feature variables and the corresponding features are stored. The extracted feature information 28 may be used, for example, by a Prognostic and Health Management and/or Condition-based maintenance (PHM/CBM) module 30 that executes on a PHM/CBM server 32. The PHM/CBM module 30 may comprise, for example, a Bayesian network or neural network that accesses information, such as the extracted feature information 28, along with other information such as historical information and other heuristics, and assesses the information to determine a health of the machine 12. The health assessment may result in any of a number of different actions, which could include, for example, the generation of a CBM work order identifying a maintenance task, the delay of a preventive maintenance work order, an estimation of a remaining useful life of the machine 12, or a component thereof, and the like.

While for purposes of illustration the raw set of data 16 has been shown as being stored in the storage 18, in other embodiments the raw set of data 16 may never be stored in a non-volatile memory such as the storage 18, or may only be stored temporarily until the subset 26 is generated. In one embodiment, the raw set of data 16 may be generated by the sensor 14 and communicated in real-time via the network 20 to the processing device 22, which in turn generates the subset 26 without ever storing the raw set of data 16 in a non-volatile memory. In another embodiment, each machine 12 may include software, firmware, or a combination thereof that receives the raw set of data 16 from the sensor 14 in real-time, generates the subset 26, and stores the subset 26 locally on the respective machine 12 for later transmission to the processing device 22, or stores the subset 26 in the storage 18. In such embodiments, the storage 18, or local storage associated with the machine 12, may be substantially smaller than would be otherwise required to store the raw set of data 16.

While, for purposes of illustration, the processing device 22 and the PHM/CBM server 32 are illustrated as separate devices, this is not necessary and in some embodiments, the functionality described herein with respect to the PHM/CBM server 32 may also be implemented by the processing device 22.

Figure 2:
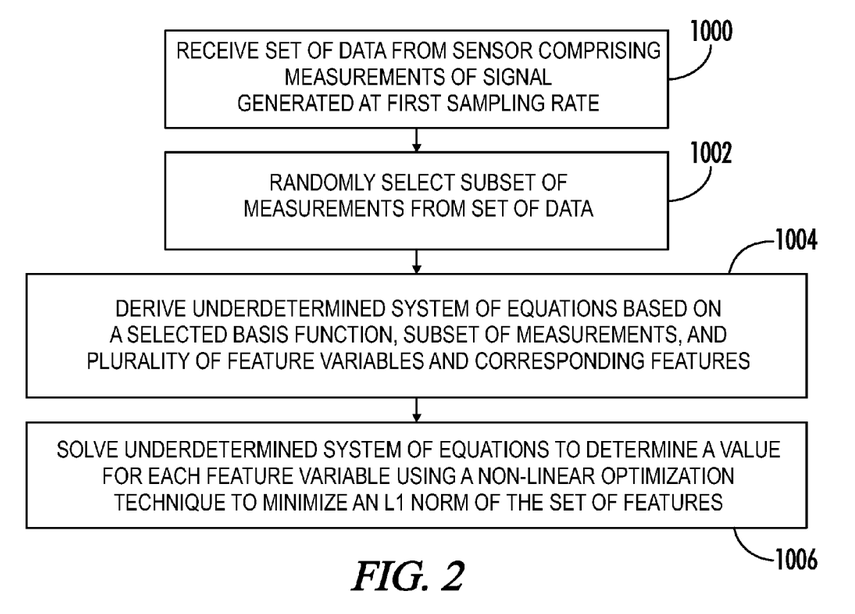
FIG. 2 is a flowchart of an exemplary process for extracting feature information from signals according to one embodiment.

FIG. 2 is a flowchart of an exemplary process for extracting features from signals according to one embodiment. FIG. 2 will be discussed in conjunction with FIG. 1. Assume that the machine 12-1 is a Humvee® vehicle, and the sensor 14-1 measures signals associated with vibrations generated by the Humvee while in operation at a first sampling rate, which is at least twice the highest expected frequency component in the measured signal, and stores measurements as the raw set of data 16 in the storage 18. The processing device 22 receives the raw set of data 16 from the storage 18 (FIG. 2, step 1000). The processing device 22 then randomly selects, or samples, the measurements in the raw set of data 16 to generate the subset 26 of measurements (FIG. 2, step 1002). As discussed above, the subset 26 may comprise substantially fewer members than that of the raw set of data 16. In one embodiment, the number of members in the subset 26 may be about 50% of the number of members of the raw set of data 16. In another embodiment, the number of members in the subset 26 may be about 25% of the number of members of the raw set of data 16. In yet another embodiment, the number of members in the subset 26 may be about 10% of the number of members of the raw set of data 16. The phrase "about," when used herein in conjunction with a value, means within a range of 10% on either side of the value.

The processing device 22 then determines the values of the feature variables that correspond to the set of features that may be present in the signal. Based on the particular set of features that are of interest, the processing device 22 selects a particular basis function. In this example, it will be assumed that the set of features of interest are frequency components of the signal, and the discrete Fourier transform is selected as the basis function. In other embodiments, other basis functions may be used, such as a discrete cosine transform, a Hilbert transform function, or a Cepstrum transform function, for example.

The processing device 22 can determine the set of features that may be present in the signal based on information associated with the raw set of data 16, such as the number of measurements in the raw set of data 16 and the first sampling rate. Such information may be stored along with the raw set of data 16, or may be determined based on other known information. For example, the first sampling rate may be determined if the number of measurements in the raw set of data 16 is known in conjunction with the time period over which the raw set of data 16 is taken.

For example, when using a conventional Fast Fourier Transform (FFT), if it is known that a sampling rate is 22 kHz and the raw set of data 16 comprises 8192 samples, the number of frequency components, or frequency "bins," that would be derived by the FFT is 4096, each of which would be 2.69 Hz wide. Thus, the processing device 22 may determine that the set of features that may be present in the signal comprises 4096 different frequency components. For each such feature (i.e., frequency component, in this example) a corresponding feature variable is determined that contains the value of an attribute of the corresponding feature. More specifically, in this example, the feature variable may identify the amplitude of the corresponding frequency component in the signal.

Based on the selected basis function, the subset 26 of the plurality of measurements, and the plurality of feature variables and the corresponding features, the processing device 22 generates an underdetermined system of equations (FIG. 2, step 1004). The system of equations is underdetermined because there are more unknowns, in particular the unknown feature variables, than there are equations.

The present disclosure is particularly effective for extracting features from signals that have two properties. The first property is that the signal is incoherent. The second property is that the desired set of features is sparse. In other words, the majority of the potential features in the set of features that may be present in the signal are zero. In particular, in the context of frequency components, the majority of the potential frequency components in the signal are zero (i.e., they are not present in the signal). As an example, signals used by vibration analysis techniques to analyze shafts, gears and bearings satisfy both properties, but many other types of signals also satisfy both properties.

Because it is known that the majority of frequencies in the set of frequencies will be zero (i.e., the set of features is sparse), it is known that the majority of the feature variables will be zero. The processing device 22 can accordingly solve the underdetermined system of equations to determine a value for each feature variable using a non-linear optimization technique to minimize an $L_1$ norm of the set of features (FIG. 2, step 1006).

A relatively simple example of the process described herein with regard to FIG. 2 will now be discussed. The raw set of data 16 will be referred to as "q." q comprises a sequence of "n" measurements. Assume that n=5. "p" represents the subset 26 of "m" measurements randomly selected from q, thus m<n. Assume that m=3. "x" represents the set of features that may be present in the signal.

In conventional signal analysis of the set of features, such as the set of frequency components, "x" would be extracted from the sensor data q using a basis function "F". This can be represented as shown by equation 1.

$$x = F(q)$$

or $$q = F^1 x \quad (1)$$

According to one embodiment of the present disclosure, the subset p can be represented as an n*m identity matrix "l"*q (i.e., m random measurements from q) ("*" as used herein represents the multiplication symbol). Thus:

$$p = lq \quad (2)$$

It therefore follows that:

$$p \approx lF^1 x \quad (3)$$

The methods of the present embodiments determine x (the set of features) from p randomly selected measurements. It is known that x is very sparse (i.e., the majority of the potential frequency components that may be in the signal are not in fact present in the signal). Equation 3 may be re-arranged into the following generic form of a system of equations:

$$Ax = p \quad (4)$$

Assuming n=5 and m=3, equation 4 may, according to one embodiment, appear substantially as the following:

|a11.x1 a12.x2 a13.x3 a14.x4 a15.x5| |p1|
|a21.x1 a22.x2 a23.x3 a24.x4 a25.x5|=|p2|
|a31.x1 a32.x2 a33.x3 a34.x4 a35.x5| |p3|

(A is a 3 by 5 matrix, x is a vector of size 5, and p is a vector of size 3).

Given that x is an n-dimensional vector and p is an m-dimensional vector and m<n, it is clear that equation 4 is an underdetermined system of equations with multiple solution sets for x. However, it is known that x is very sparse. To find a solution to equation 4 that has a maximum number of "0"'s in x is an NP hard problem. However, in the context of this problem, $L_0$-norm can be approximated by $L_1$-norm because there is a very high probability that they converge to the same solution. Non-linear optimization techniques can thus be used to minimize the $L_1$-norm of x in solving the set of equations 4. Non-limiting examples of suitable non-linear optimization techniques which may be used in accordance with the present embodiments include: least squares optimization with $L_1$-Norm regularization; multilayer perceptron (neural network) with non-linear transfer function; non-derivative optimization (Powell, 1964, Computer Journal, 7, pp. 155-162), the disclosure of which is hereby incorporated herein by reference; backpropagation/Polak-Ribiére variation of conjugate gradient (p. 78 of Scales, L. E., *Introduction to Non-Linear Optimization*, New York, Springer-Verlag, 1985), the disclosure of which is hereby incorporated herein by reference; and Brent's algorithm (p. 46 of Scales, L. E., *Introduction to Non-Linear Optimization*, New York, Springer-Verlag, 1985).

Figure 3:
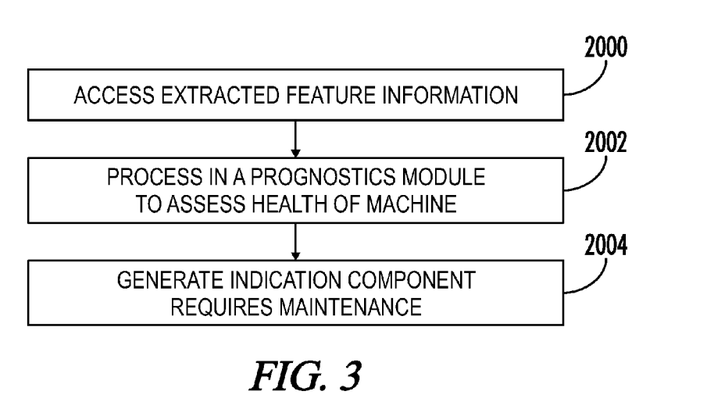
FIG. 3 is a flowchart of an exemplary process for utilizing the extracted feature information in a ~Prognostic and Health Management and/or Condition-based maintenance (PHM/CBM) context according to one embodiment.

FIG. 3 is a flowchart of an exemplary process for utilizing the extracted feature information 28 in a condition-based maintenance (CBM) context according to one embodiment. FIG. 3 will be discussed in conjunction with FIG. 1. After the extracted feature information 28 has been determined by the feature extraction module 24, the PHM/CBM server 32 accesses the extracted feature information 28 from the storage 18 (FIG. 3, step 2000). The PHM/CBM module 30 then analyzes the extracted feature information 28, typically in conjunction with one or more of the following: one or more previous sets of extracted feature information 28, taken over several periods of time and relating to the machine 12-1; information identifying maintenance performed on the machine 12-1; and other heuristics. This analysis is done in order to assess the health of the machine 12-1 (FIG. 3, step 2002). In one embodiment, the PHM/CBM server 32 may determine, based on such information, that a component of the machine 12-1 is nearing failure, and generate an indication that the component requires maintenance. Such an indication could be presented on a display, printed out on a hard copy, or may take the form of an automatically generated work order that identifies a necessary maintenance task for the component.

Figure 4A:
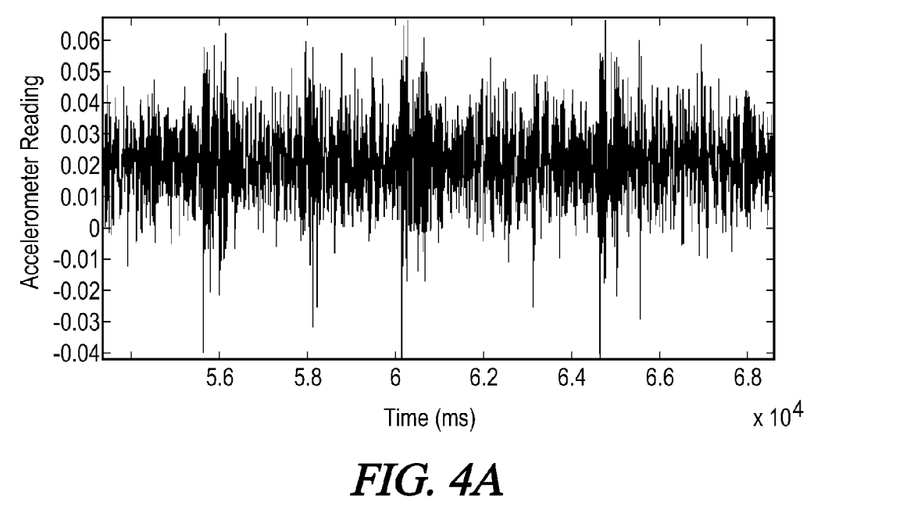
FIGS. 4A and 4B are graphs that illustrate an exemplary signal having properties suitable for the subject matter of the disclosure.
Figure 4B:
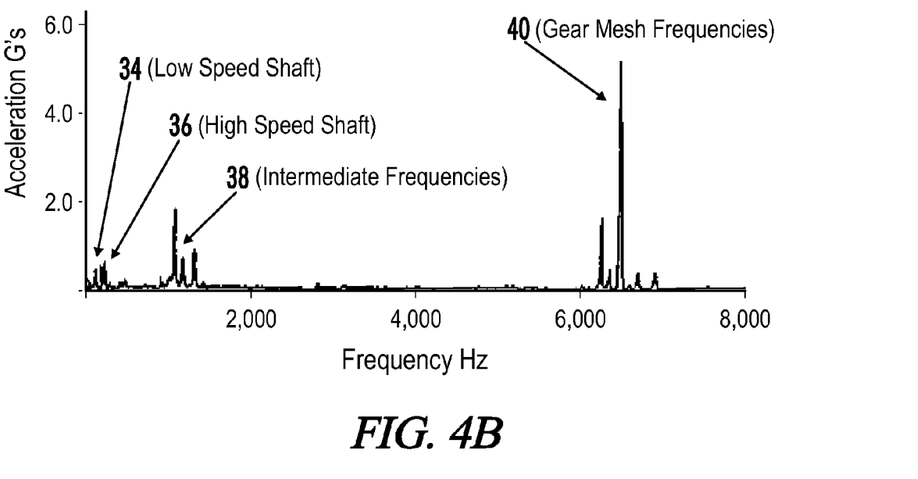

FIGS. 4A and 4B are graphs that illustrate am exemplary signal having properties suitable for the subject matter of the disclosure. FIG. 4A illustrates an exemplary incoherent signal that may be generated by the machine 12-1 and sensed by the sensor 14-1. FIG. 4B illustrates the sparse nature of the set of features that comprises the frequency components that may be present in the signal, as illustrated in FIG. 4A. Thus, the amplitude of the majority of the frequency components that may be present in the signal are actually zero, or substantially zero, indicating the absence of those particular frequency components in the signal. In accordance with one embodiment of the present disclosure, certain frequencies may be of particular interest because of known relationships between the frequencies and particular components. For example, FIG. 4B illustrates a frequency 34 associated with a low speed shaft of a vehicle, a frequency 36 associated with a high speed shaft of the vehicle, a group of frequencies 38 associated with intermediate frequencies, and a group of frequencies 40 associated with a gear mesh. The presence, absence, or magnitude of such frequencies may be used by the PHM/CBM module 30 to assess the health of the vehicle, or components thereof.

In particular, Tables 1-3 below illustrate exemplary data which may be used by the PHM/CBM module 30 to aid in assessing the health of various components of the machine 12-1.

TABLE 1

| GEAR FAULTS | WHERE TO LOOK (FREQUENCY) | FAULT SIGNATURES |
|---|---|---|
| Broken tooth | Gear Mesh Frequency (GMF), Natural Frequency | Strong sidebands, sidebands stronger than GMF, Sidebands around Natural Frequency |
| Chipped tooth | GMF | Strong sidebands |
| Eccentricity | GMF | Strong sidebands and distinct difference in amplitude |
| Gear Misalignment | Higher harmonics of GMF, Shaft's frequency | Strong side bands around higher harmonics and higher harmonics is stronger than GMF, Strong RPM |

TABLE 2

| BEARING FAULTS | WHERE TO LOOK (FREQUENCY) | FAULT SIGNATURES |
|---|---|---|
| Outer Race Defect | Ball Pass Frequency of Outer Race (BPFO) and multiples (N/2) RPS[1 − (B/P)cos φ] (Hz) (Revolutions Per Second (RPS) = RPM/60) (P = pitch diameter) (B = ball/roller diameter) | Multiples of BPFO |
| Inner Race Defect | Ball Pass Frequency of Inner Race (BPFI) and multiples ((N/2) RPS[1 + (B/P)cos φ] ) Hz | Decreasing size of harmonics modulated by operating speed |
| Ball Defect | Ball Spin Frequency (BSF) or Fundamental Train Frequency (FTF) and multiples | Natural Frequencies modulated by FTF |

TABLE 2-continued

| BEARING FAULTS | WHERE TO LOOK (FREQUENCY) | FAULT SIGNATURES |
|---|---|---|
| | $(P/2B) RPS[1 - (B/P)2\cos2\phi]$ (Hz) | |

TABLE 3

| SHAFT FAULTS | WHERE TO LOOK (FREQUENCY) | FAULT SIGNATURES |
|---|---|---|
| Bend Shaft | Harmonics of Shaft's frequency | Strong 2x RPS |
| Bend Shaft | Phase difference of RPS | Phase difference between input and output RPS |
| Imbalance Shaft | RPS | Strong RPS component |
| Bad Key | RPS and multiple | Strong RPS and 2xRPS |

Figure 5A:
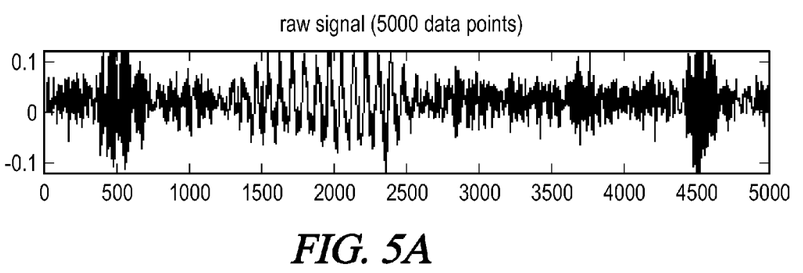
FIG. 5A is a graph of an exemplary signal associated with a gearbox of a machine sampled in accordance with the Nyquist-Shannon sampling theorem for a sampling period of 5000 samples.
Figure 5B:
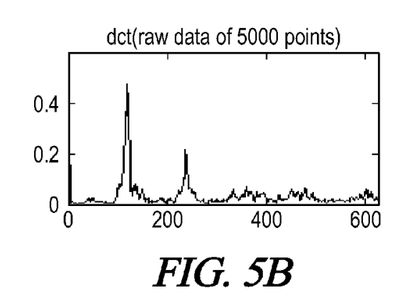
FIG. 5B is a graph showing frequency components of the signal illustrated in FIG. 5A after applying a discrete cosine transform to 5000 samples of the signal illustrated in FIG. 5A.

FIGS. 5A-5E illustrate the effectiveness of the present disclosure based on conventional extraction features from a signal in comparison to the extraction of features from the signal in accordance with the present disclosure. FIG. 5A is a graph of an exemplary signal associated with a gearbox of a machine sampled in accordance with the Nyquist-Shannon sampling theorem for a sampling period of 5000 samples. FIG. 5B is a graph showing features (i.e., frequency components) extracted from the signal illustrated in FIG. 5A utilizing conventional mechanisms by applying a discrete cosine transform to the 5000 samples.

Figure 5C:
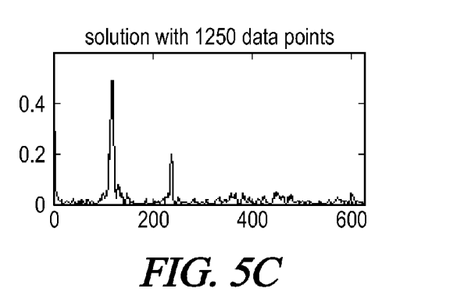
FIG. 5C is a graph showing frequency components extracted from the signal illustrated in FIG. 5A, utilizing a method for extracting features of the present disclosure based on 1250 randomly selected samples from the 5000 samples of the signal of FIG. 5A.

FIG. 5C is a graph showing frequency components extracted from the signal illustrated in FIG. 5A utilizing an embodiment of the present disclosure, based on a subset of 1250 randomly selected samples (i.e., measurements) from the 5000 samples (i.e., measurements) of the signal of FIG. 5A. Accordingly, the present embodiments, utilizing only 20% of the 5000 samples, extracted nearly identical signal features as in accordance with a conventional mechanism requiring 5000 samples as illustrated in FIG. 5B.

Figure 5D:
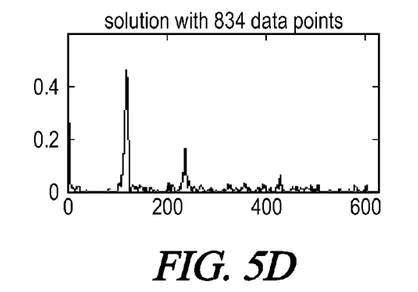
FIG. 5D is a graph showing frequency components extracted from the signal illustrated in FIG. 5A, utilizing a method for extracting features of the present disclosure based on 834 randomly selected samples from the 5000 samples of the signal of FIG. 5A.

FIG. 5D is a graph showing frequency components extracted from the signal illustrated in FIG. 5A utilizing an embodiment of the present disclosure, based on a subset of 834 randomly selected samples (i.e., measurements) from the 5000 samples (i.e., measurements) of the signal of FIG. 5A. Accordingly, the present embodiments, utilizing only about 17% of the 5000 samples, extracted very similar features as in accordance with a conventional mechanism requiring 5000 samples as illustrated in FIG. 5B.

Figure 5E:
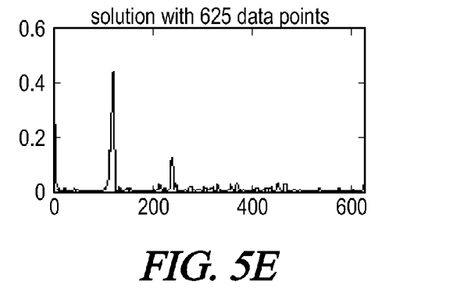
FIG. 5E is a graph showing frequency components extracted from the signal illustrated in FIG. 5A, utilizing a method for extracting features of the present disclosure based on 625 randomly selected samples from the 5000 samples of the signal of FIG. 5A.

FIG. 5E is a graph showing frequency components extracted from the signal illustrated in FIG. 5A utilizing an embodiment of the present disclosure, based on a subset of 625 randomly selected samples (i.e., measurements) from the 5000 samples (i.e., measurements) of the signal of FIG. 5A. Accordingly, the present embodiments, utilizing only 12.5% of the 5000 samples, extracted similar features as in accordance with a conventional mechanism requiring 5000 samples as illustrated in FIG. 5B.

As illustrated, the present disclosure provides a mechanism for extracting features from a signal utilizing only a fraction of the signal measurements required by conventional feature extraction mechanisms. The present disclosure thus substantially reduces both the amount of storage required to store signal measurements, and reduces the processing power required to extract feature information from the signal.

Figure 6:
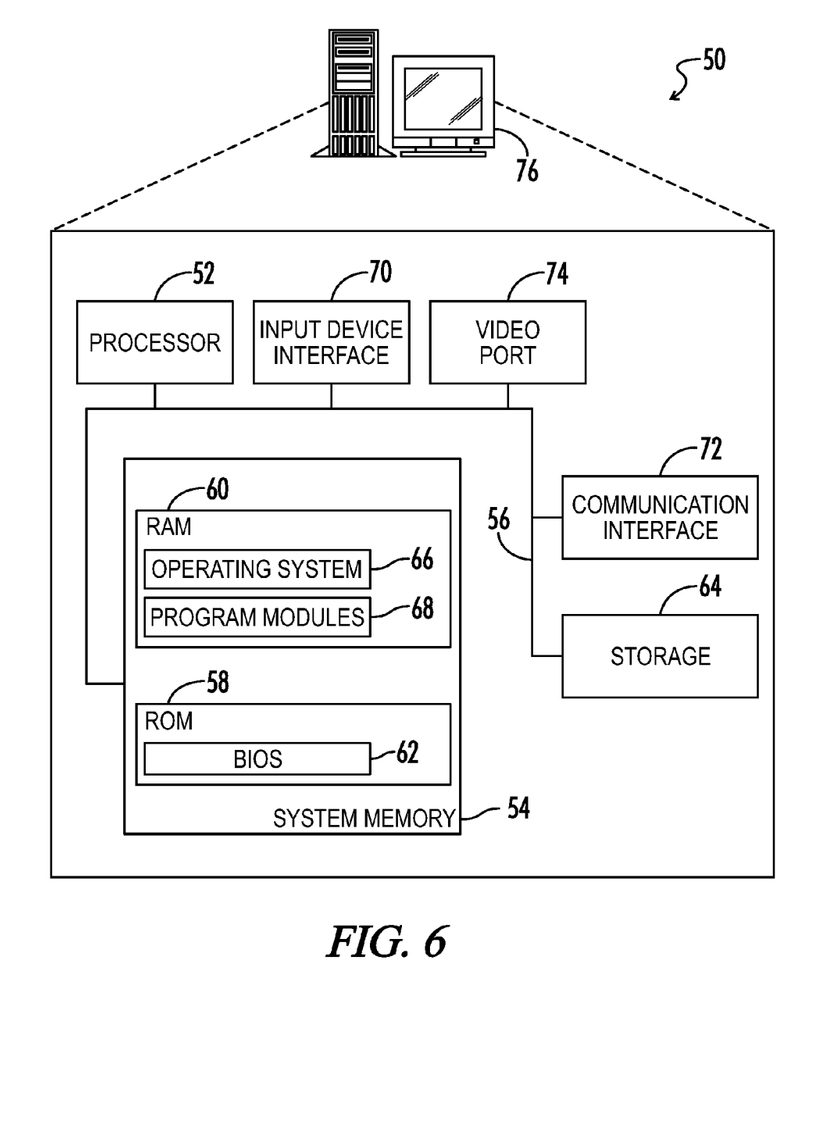
FIG. 6 is a block diagram of an exemplary processing device suitable for implementing the embodiments of the present disclosure, according to one embodiment.

FIG. 6 is a block diagram illustrating an exemplary processing device 50 according to one embodiment. The processing device 50 may comprise any device capable of executing software instructions to implement the functionality described herein, such as a work station, a desktop or laptop computer, a tablet computer, or any device capable of implementing such functionality through circuitry. The processing device 50 includes a processor 52, a system memory 54, and a system bus 56. The system bus 56 provides an interface for the system components including, but not limited to, the system memory 54 and the processor 52. The processor 52 can be any commercially available or proprietary processor. Dual microprocessors and other multi-processor architectures may also be employed as the processor 52.

The system bus 56 may be any of several types of bus structures that may further interconnect to a memory bus (with or without a memory controller), a peripheral bus, and/or a local bus using any of a variety of commercially available bus architectures. The system memory 54 may include non-volatile memory 58 (e.g., read only memory (ROM), erasable programmable read only memory (EPROM), electrically erasable programmable read only memory (EEPROM), etc.) and/or volatile memory 60 (e.g., random access memory (RAM)). A basic input/output system (BIOS) 62 may be stored in the non-volatile memory 58, and can include the basic routines that help to transfer information between elements within the processing device 50. The volatile memory 60 may also include a high-speed RAM, such as static RAM, for caching data.

The processing device 50 may further include a computer-readable storage 64, which may comprise, for example, an internal hard disk drive (HDD) (e.g., enhanced integrated drive electronics (EIDE) or serial advanced technology attachment (SATA)), HDD (e.g., EIDE or SATA) for storage, flash memory, or the like. The computer-readable storage 64 and other drives, associated with computer-readable and computer-usable media, provide non-volatile storage of data, data structures, computer-executable instructions, and so forth. Although the description of the computer-readable media above refers to an HDD, it should be appreciated by those skilled in the art that other types of media which are readable by a computer, such as Zip disks, magnetic cassettes, flash memory cards, cartridges, and the like, may also be used in the exemplary operating environment, and further, that any such media may contain computer-executable instructions for performing novel methods of the disclosed architecture.

A number of modules can be stored in the computer-readable storage 64 and in the volatile memory 60, including an operating system 66 and one or more program modules 68, which may implement the functionality described herein in whole or in part, including, for example, the functionality associated with the feature extraction module 24, and in one embodiment, the PHM/CBM module 30, and other processing and functionality described herein. It is to be appreciated that the embodiments can be implemented with various commercially available operating systems 66 or combinations of operating systems 66.

All or a portion of the embodiments may be implemented as a computer program product stored on a transitory or non-transitory computer-usable or computer-readable storage medium, such as the computer-readable storage 64, which includes complex programming instructions, such as complex computer-readable program code, configured to cause the processor 52 to carry out the steps described herein. Thus, the computer-readable program code can comprise software instructions for implementing the functionality of the embodiments described herein when executed on the processor 52. The processor 52, in conjunction with the program modules 68 in the volatile memory 60, may serve as a control system for the processing device 50 that is configured to, or adapted to, implement the functionality described herein.

A user may be able to enter commands and information into the processing device 50 through one or more input devices, such as, for example, a keyboard (not illustrated); a pointing device, such as a mouse (not illustrated); or a touch-sensitive surface. Other input devices may include a microphone, an infrared (IR) remote control, a joystick, a game pad, a stylus pen, or the like. These and other input devices may be connected to the processor 52 through an input device interface 70 that is coupled to the system bus 56, but can be connected by other interfaces such as a parallel port, an IEEE 1394 serial port, a Universal Serial Bus (USB) port, an IR interface, etc.

The processing device 50 may also include a communication interface 72 suitable for communicating with the network 20, and/or suitable for interfacing with other external storage mediums, such as flash drives, or the like. The processing device 50 may also include a video port 74 that interfaces with a display 76 that provides information to the user via, for example, a user interface.

Those skilled in the art will recognize improvements and modifications to the embodiments of the present disclosure. All such improvements and modifications are considered within the scope of the concepts disclosed herein and the claims that follow.

What is claimed is:

1. A method for extracting information from data representing a signal, comprising:
    receiving, by a processing device, a set of data from a sensor, the set of data comprising a plurality of measurements of the signal generated at a first sampling rate;
    randomly selecting, by the processing device, a subset of the plurality of measurements, the subset having fewer members than the set of data;
    determining a value for each of a plurality of amplitude variables, each amplitude variable corresponding to a particular frequency component in a set of frequency components, the set of frequency components having a greater number of members than the subset of the plurality of measurements, by:
        deriving an underdetermined system of equations based on:
            a selected basis function;
            the subset of the plurality of measurements; and
            the plurality of amplitude variables and corresponding frequency components;
        solving the underdetermined system of equations to determine the value for each amplitude variable using a non-linear optimization technique to minimize an $L_1$ norm of the set of frequency components, wherein the value of each amplitude variable identifies an amplitude of the corresponding frequency component in the signal; and
    storing frequency component information including the value of at least some of the amplitude variables and corresponding frequency components in a storage medium.

2. The method of claim 1, wherein deriving the underdetermined system of equations is further based on the first sampling rate and the number of members in the set of data.

3. The method of claim 1, wherein the first sampling rate comprises a sampling rate in accordance with the Nyquist-Shannon sampling theory based on a selected highest frequency component of the signal, and wherein the number of members in the subset is about $1/10$ of the number of members in the set of data.

4. The method of claim 1, wherein the plurality of measurements are in a time domain, and the set of frequency components are in a frequency domain.

5. The method of claim 1, wherein the signal is generated by a machine, and further comprising:
    accessing, by a prognostics module, the frequency component information; and
    based on the frequency component information, issuing an indication that the machine requires a maintenance task.

6. The method of claim 1, wherein the signal is generated by a machine, and further comprising:
    performing the method for determining the value for each of the plurality of amplitude variables a plurality of times over a duration of time;
    accessing the frequency component information for each of the plurality of times; and
    based on the frequency component information for each of the plurality of times, issuing an indication that the machine requires a maintenance task.

7. The method of claim 1, wherein the selected basis function comprises one of a discrete Fourier transform function, a discrete cosine transform, a Hilbert transform function, and a Cepstrum transform function.

8. The method of claim 1, wherein the signal represents a vibration associated with a machine, and further comprising:
    accessing, by a prognostics module, the frequency component information; and
    based on the frequency component information, determining that the signal includes a frequency component that indicates an abnormal condition of the machine.

9. The method of claim 8, wherein the vibration is associated with one of a shaft, a gear and a bearing of the machine.

10. A processing device for extracting information from data representing a signal, comprising:
    a communication interface configured to receive a set of data, the set of data comprising a plurality of measurements of the signal generated at a first sampling rate;
    a processor communicatively coupled to the communication interface, and configured to:
        randomly select a subset of the plurality of measurements, the subset having fewer members than the set of data;
        determine a value for each of a plurality amplitude variables, each amplitude variable corresponding to a particular frequency component in a set of frequency components, the set of frequency components having a greater number of members than the subset of the plurality of measurements, by:
            deriving an underdetermined system of equations based on:
                a selected basis function;
                the subset of the plurality of measurements; and
                the plurality of amplitude variables and corresponding frequency components;
            solving the underdetermined system of equations to determine the value for each amplitude variable using a non-linear optimization technique to minimize an $L_1$ norm of the set of frequency components; and
        store frequency component information including the value of at least some of the amplitude variables and corresponding frequency components in a storage medium.

11. The processing device of claim 10, wherein deriving the underdetermined system of equations is further based on the first sampling rate and the number of members in the set of data.

12. The processing device of claim 10, wherein the first sampling rate comprises a sampling rate in accordance with the Nyquist-Shannon sampling theory based on a selected highest frequency component of the signal, and wherein the number of members in the subset is about 1/10 of the number of members in the set of data.

13. The processing device of claim 10, wherein the signal is generated by a machine, and wherein the processor is further configured to:
   access the frequency component information; and
   based on the frequency component information, issue an indication that the machine requires a maintenance task.

14. The processing device of claim 10, wherein the signal represents a vibration associated with a machine, and wherein the processor is further configured to:
   access the frequency component information; and
   based on the frequency component information, determine that the signal includes a frequency component that indicates an abnormal condition of the machine.

15. A method for extracting information from a signal, comprising:
   randomly selecting, by a processing device, a subset of a plurality of measurements of the signal generated by a sensor at a first sampling rate;
   determining, by the processing device, a value for each of a plurality of amplitude variables, each amplitude variable in the plurality of amplitude variables associated with a respective frequency component in a set of frequency components, the set of frequency components having a greater number of members than the subset, by:
      deriving an underdetermined system of equations based on a selected basis function, the subset of the plurality of measurements, and the plurality of amplitude variables;
      solving the underdetermined system of equations to determine the value of each of the amplitude variables using a non-linear optimization technique to minimize an $L_1$ norm of the sot of frequency components; and
   based on the amplitude variables and corresponding frequency components, determining that the signal includes a frequency component that indicates an abnormal condition of the machine.

16. The method of claim 15, wherein the signal represents a vibration associated with one of a shaft, a gear and a bearing of the machine.

17. The method of claim 15, wherein the first sampling rate comprises a sampling rate in accordance with the Nyquist-Shannon sampling theory based on a selected highest frequency component of the signal, and wherein the number of members in the subset is about 1/10 of the number of members in the set of data.

18. The method of claim 15, wherein the set of measurements are in a time domain, and the set of frequency components are in a frequency domain.

* * * * *